(12) United States Patent
Chandran et al.

(10) Patent No.: US 6,672,892 B2
(45) Date of Patent: Jan. 6, 2004

(54) PACKAGE RETENTION MODULE COUPLED DIRECTLY TO A SOCKET

(75) Inventors: Biju Chandran, Chandler, AZ (US); Carlos A. Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/968,403

(22) Filed: Sep. 28, 2001

(65) Prior Publication Data

US 2003/0064618 A1 Apr. 3, 2003

(51) Int. Cl.[7] .............................................. H01R 13/62
(52) U.S. Cl. ...................................... 439/330; 361/710
(58) Field of Search ............................... 439/330, 485, 439/487, 73; 361/710; 257/718, 719

(56) References Cited

U.S. PATENT DOCUMENTS

| | | | | |
|---|---|---|---|---|
| 4,547,031 A | * | 10/1985 | Korsunsky | 439/325 |
| 5,117,330 A | * | 5/1992 | Miazga | 361/760 |
| 5,448,449 A | | 9/1995 | Bright et al. | 361/704 |
| 5,671,118 A | | 9/1997 | Blomquist | 361/704 |
| 5,761,036 A | | 6/1998 | Hopfer et al. | 361/704 |
| 5,777,852 A | * | 7/1998 | Bell | 361/769 |
| 5,870,287 A | | 2/1999 | Rodriguez et al. | 361/704 |
| 6,175,499 B1 | | 1/2001 | Adams et al. | 361/704 |
| 6,250,375 B1 | | 6/2001 | Lee et al. | 165/80.3 |
| 6,347,036 B1 | | 2/2002 | Yeager et al. | 361/687 |

* cited by examiner

*Primary Examiner*—Renee Luebke
*Assistant Examiner*—Ann McCamey
(74) *Attorney, Agent, or Firm*—Pillsbury Winthrop LLP

(57) ABSTRACT

A retention module includes a socket to connect to a package. At least one retention arm is coupled to the socket. The at least one retention arm extends perpendicular to the socket. At least one retention clamp is coupled to the at least one retention arm to secure placement of a heat sink against a surface of a package assembly.

27 Claims, 5 Drawing Sheets

PACKAGE RETENTION MODULE COUPLED DIRECTLY TO A SOCKET

BACKGROUND OF THE INVENTION

1. Field of the Invention

The present invention generally relates to a retention module for retaining a heat sink to a package assembly. More particularly, the present invention relates to a package assembly retention module that is coupled directly to a socket.

2. Discussion of the Related Art

A heat sink is usually placed in contact with an electronic device, such as a Central Processing Unit (CPU), for removing heat therefrom. For higher-power devices, an integrated heat spreader (IHS) lid is generally placed between the heat sink and the electronic device to facilitate cooling the device. The electronic device is often mounted on a socket that couples to the motherboard. Various retention modules have been used for maintaining intimate contact between the heat sink and the IHS lid, or the bare package.

As shown in FIG. 5, a typical retention module is attached to the motherboard 150, often by passing the retention module through a motherboard hole 520 that is drilled into the motherboard 150 outside the perimeter of the socket 130 that couples to the motherboard 150. Drilling motherboard holes 520 takes up valuable space on the motherboard 150, approximately 25–50% more area than the socket 130 alone, thereby increasing the price of the motherboard 150. Furthermore, the area occupied by the motherboard holes 520 is close to a package 230, a space highly desirable to design engineers to place capacitors, voltage regulators, and other electrical components to optimize performance of the package 230. Holes are generally drilled into the heat sink 210 as well, so that the retention module may also pass through the heat sink 210. The heat sink 210 must extend outside the perimeter of the socket 130 that couples to the motherboard 150 to provide sufficient space for the retention module to pass through. Fasteners 530, such as clamps, screws, or nuts, are then coupled to the ends of the retention module to ensure a secure contact between the heat sink 210 and the IHS lid 220 or the package 230. A tool is required to apply the fasteners 530, which makes the assembly procedure more complicated.

Furthermore, having separate retention modules may give rise to inventory issues and increase both the cost of the package system and the number of piece parts. Although typical retention modules may be required to support the large heat sinks generally required in servers, the use of such retention modules may often be unnecessary and add cost in lower-power systems.

Thus, a retention module that requires neither additional motherboard space nor modifications to the motherboard is required.

DETAILED DESCRIPTION

Figure 1A:
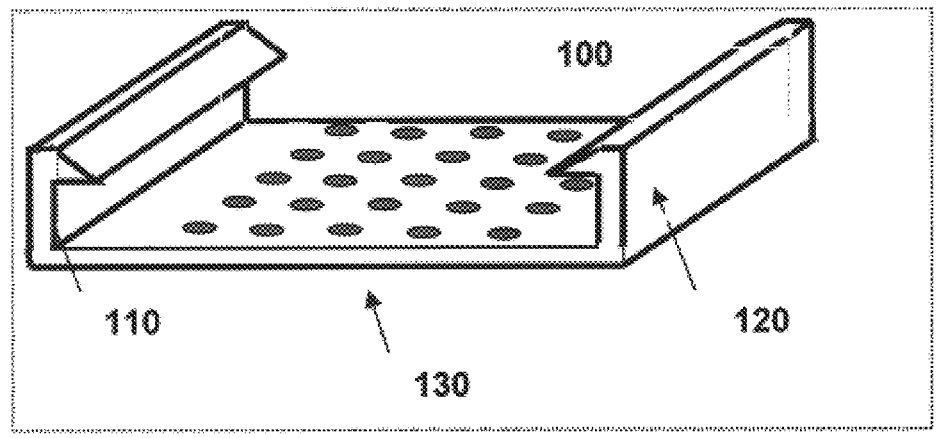
FIG. 1 illustrates a retention module according to an embodiment of the present invention.
Figure 1B:
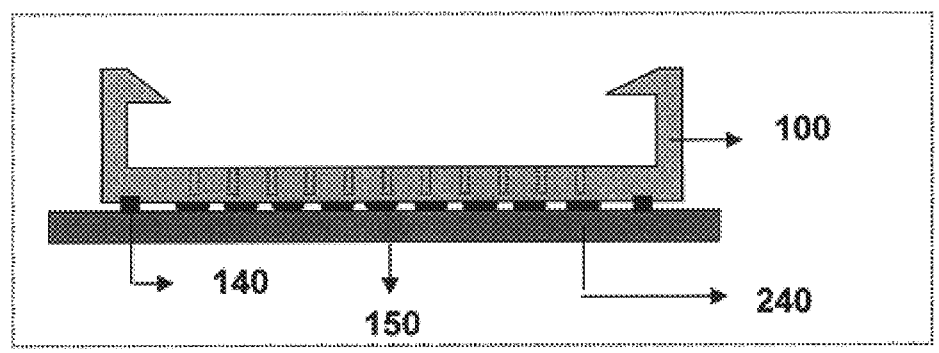
Figure 5:
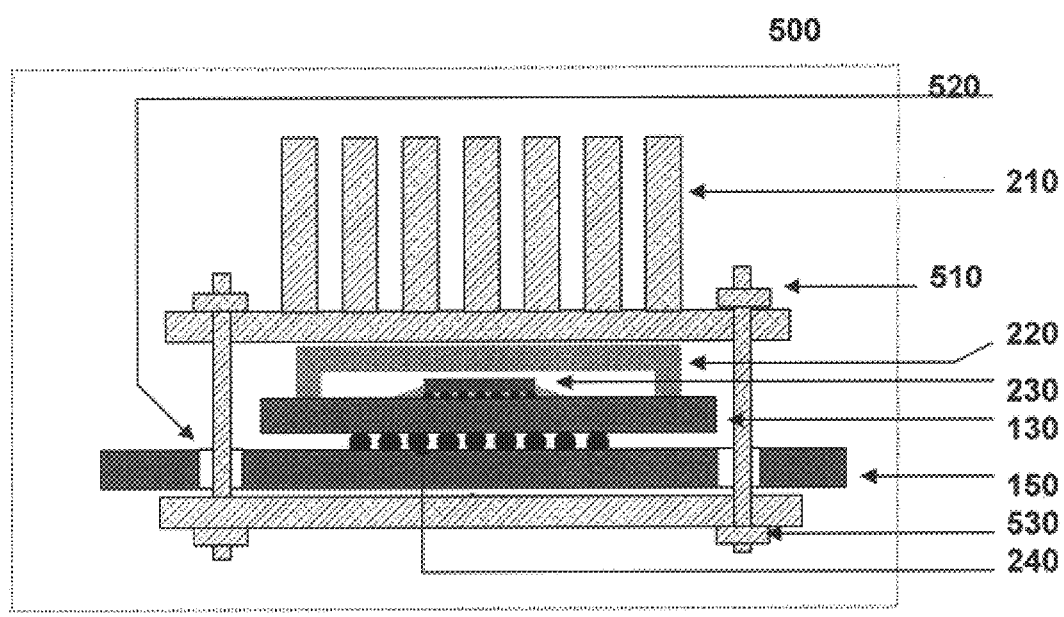
FIG. 5 illustrates a conventional prior art package system.

FIG. 1 illustrates a retention module according to an embodiment of the present invention. The retention module 100 includes a socket 130, at least one retention arm 120, and at least one retention clamp 110. The retention arm 120 is coupled to the socket 130 and preferably extends perpendicular to the socket 130. This is in contrast to the prior art retention module/spring 510 of FIG. 5, which is coupled to the motherboard 150. However, the retention arm 120 need not be perpendicular, and any configuration is acceptable. The socket 130 couples to a socket connector 240 on a motherboard 150. The retention clamp 110 is coupled to the retention arm 120 on the end opposite the socket 130 to secure placement of a heat sink 210 (see FIG. 2) against a surface of a package assembly. The package assembly may include a package 230 (see FIG. 2) or both an integrated heat spreader (IHS) lid 220 and a package 230.

A second opposing retention arm 120 according to a preferred embodiment of the invention is coupled to the socket 130, preferably extending perpendicular to the socket 130 and in a direction parallel to the first retention arm 120. The retention arms 120 define a receiving space for receiving a package assembly and a heat sink 210 (see FIG. 2). The retention arms 120 may be flexible to allow the package assembly and the heat sink 210 to be received from a direction perpendicular to the plane in which the socket 130 lies; however, the retention arms 120 may also be rigid.

In another embodiment of the present invention, the socket 130, the retention arm(s) 120, and the retention clamp(s) 110 are formed from a unitary member. This is in contrast to the prior art retention module/spring 510 of FIG. 5, which includes multiple pieces. However, the socket 130, the retention arm(s) 120, and the retention clamp(s) 110 may be formed of multiple pieces, as well. In yet another embodiment, the retention module 100 or any combination of its subparts (i.e., the socket 130, the retention arm(s) 120, and/or the retention clamp(s) 110) are formed of plastic (which may be injection molded) or another suitable material.

Figure 2:
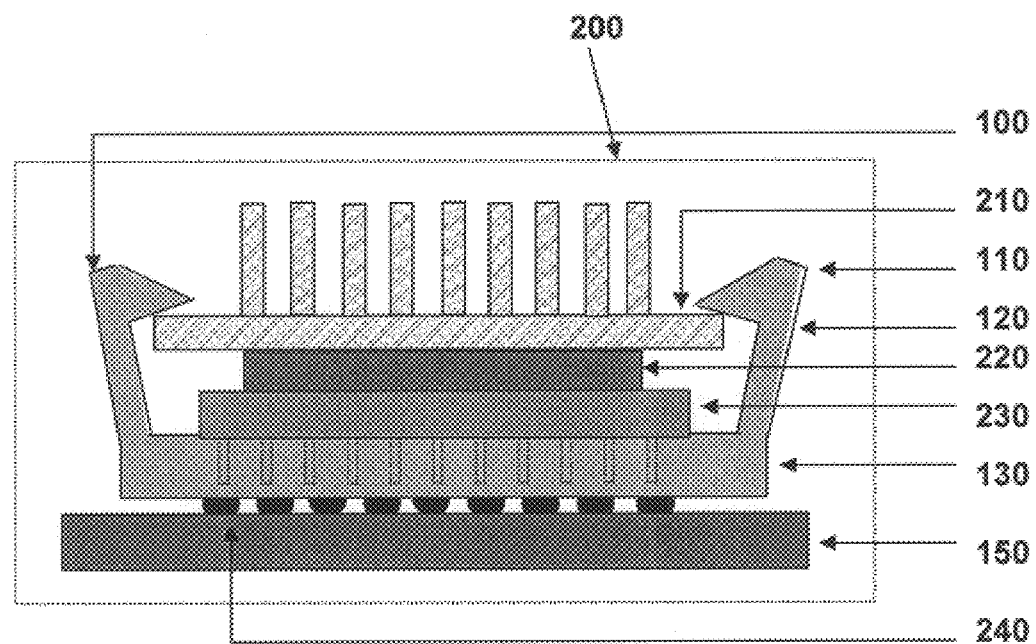
FIG. 2 illustrates a package system according to an embodiment of the present invention.

FIG. 2 illustrates a package system 200 according to an embodiment of the present invention. The package system 200 includes a package assembly and a retention module 100. The package assembly may include a package 230 or both an integrated heat spreader (IHS) lid 220 and a package 230.

The retention module 100 includes a socket 130, at least one retention arm 120, and at least one retention clamp 110. The retention arm 120 is coupled to the socket 130 and preferably extends perpendicular to the socket 130. This is in contrast to the prior art retention module/spring 510 of FIG. 5, which is coupled to the motherboard 150. The socket 130 couples to the motherboard 150 via the socket connector 240. The retention clamp 110 is coupled to the retention arm 120 on the end opposite the socket 130 to secure placement of a heat sink 210 against a surface of a package assembly. The retention clamp 110 secures onto the heat sink 210, a package 230 surface, and/or an IHS lid 220 surface by an engagement fit.

Figure 3:
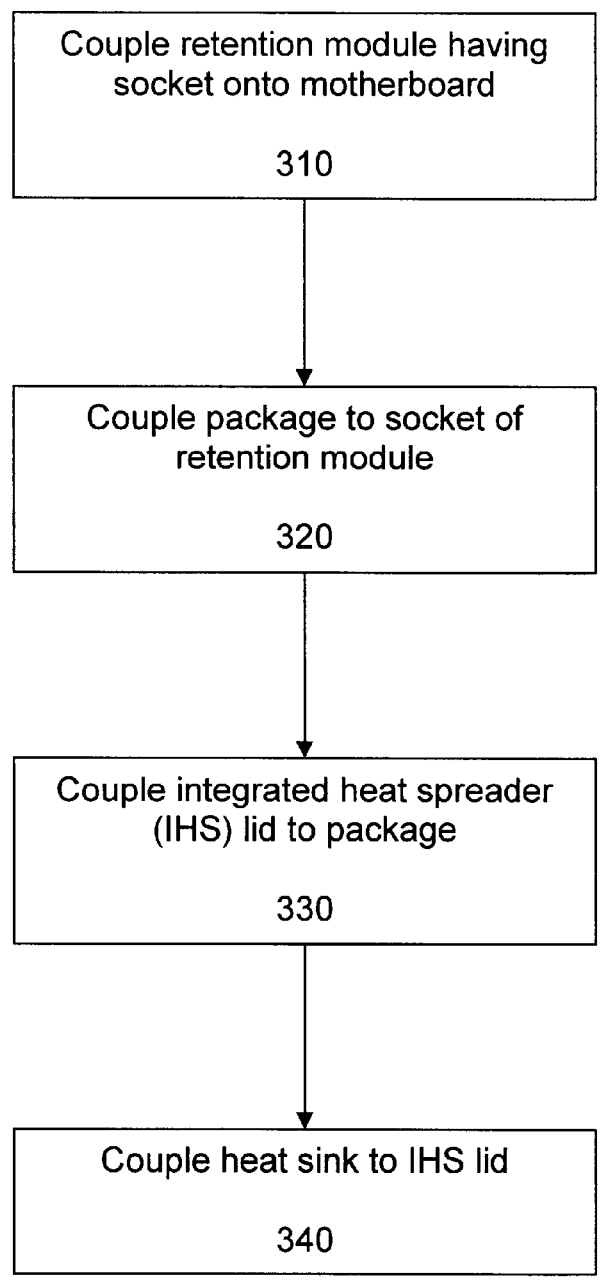
FIG. 3 illustrates a flow chart for a method of retaining a heat sink to a package according to an embodiment of the present invention.

FIG. 3 illustrates a flow chart for a method of retaining a heat sink to a package according to an embodiment of the present invention. Within the method, a retention module 100 having a socket 130 is coupled 310 onto a motherboard 150. A package 230 is coupled 320 to the socket 130 of the retention module 100. An integrated heat spreader (IHS) lid 220 is coupled 330 to the package 230. A heat sink 210 is coupled 340 to the IHS lid 220. According to the embodiment as illustrated in FIG. 2, the retention module 100 secures onto a heat sink 210, a package 230 surface, and/or an IHS lid 220 surface by an engagement fit.

Figure 4:
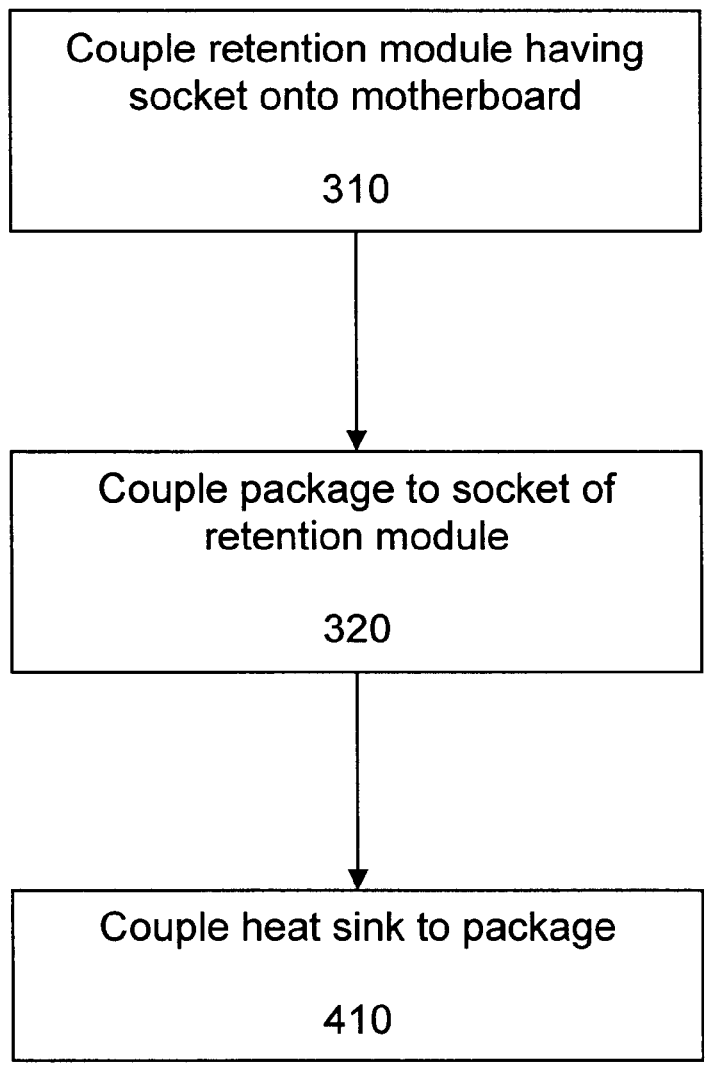
FIG. 4 illustrates a flow chart for a method of retaining a heat sink to a package according to another embodiment of the present invention.

FIG. 4 illustrates a flow chart for a method of retaining a heat sink to a package according to another embodiment of the present invention. Within the method, a retention module 100 having a socket 130 is coupled 310 onto a motherboard 150. A package 230 is coupled 320 to the socket 130 of the retention module 100. A heat sink 210 is coupled 410 to the package 230. According to the embodiment as illustrated in FIG. 2, a retention module 100 secures onto a heat sink 210 or a package 230 surface by an engagement fit.

In summary, the retention module 100 according to the present invention eliminates motherboard holes. This configuration reduces the amount of space consumed on the motherboard 150, thereby reducing the price of the motherboard 150. Furthermore, attaching the retention module(s) 100 to the socket 130, or incorporating the retention module(s) 100 and the socket 130 into a unitary member, mitigates inventory issues and decreases both the cost of the package system 200 and the number of piece parts. The retention module 100 also simplifies field assembly and disassembly.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A retention module, comprising:
    a socket to directly connect to a package, wherein the socket is a single piece;
    at least one retention arm coupled to the socket, perpendicular to the socket; and
    at least one retention clamp coupled to the at least one retention arm to secure placement of a heat sink against a surface of a package assembly, wherein the at least one retention arm and the at least one retention clamp and the socket are monolithic.

2. The retention module according to claim 1, wherein the socket, the at least one retention arm, and the at least one retention clamp are formed from a unitary member.

3. The retention module according to claim 1, wherein the socket connects to a motherboard.

4. The retention module according to claim 1, wherein the retention module is formed of plastic.

5. The retention module according to claim 1, wherein the at least one retention arm is plastic.

6. The retention module according to claim 1, wherein the socket is plastic.

7. A retention module, comprising:
    a socket to directly connect to a package, wherein the socket is a single piece;
    a first retention arm and a second retention arm coupled to the socket, each perpendicular to the socket; and
    at least two retention clamps, a first retention clamp coupled to the first retention arm and a second retention clamp coupled to the second retention arm, to secure placement of a heat sink against a surface of a package assembly, wherein the first retention arm, the first retention clamp, the second retention arm, the second retention clamp and the socket are monolithic.

8. The retention module according to claim 7, wherein the socket, the first retention arm, the second opposing retention arm, and the at least one retention clamp are formed from a unitary member.

9. The retention module according to claim 7, wherein the socket connects to a motherboard.

10. The retention module according to claim 7, wherein the retention module is formed of plastic.

11. The retention module according to claim 7, wherein the first retention arm and the second opposing retention arm are plastic.

12. The retention module according to claim 7, wherein the socket is plastic.

13. A package system, comprising:
    a package assembly; and
    a retention module, including:
        a socket to directly interconnect a package and a motherboard, wherein the socket is a single piece,
        at least one retention arm coupled to the socket, perpendicular to the socket, and
        at least one retention clamp coupled to the at least one retention arm to secure placement of a heat sink against the package assembly, wherein the at least one retention arm, the at least one retention clamp and the socket are monolithic.

14. The package system according to claim 13, wherein the package assembly includes an integrated heat spreader (IHS) lid and a package.

15. The package system according to claim 13, wherein the package assembly includes a package.

16. The package system according to claim 13, wherein the socket, the at least one retention arm, and the at least one retention clamp are formed from a unitary member.

17. The package system according to claim 13, wherein the retention module is formed of plastic.

18. The package system according to claim 13, wherein the at least one retention arm is plastic.

19. The package system according to claim 13, wherein the socket is plastic.

20. A method of retaining a heat sink to a package, comprising:
    coupling a socket directly to a motherboard, wherein the socket is a single piece, and at least one retention arm is coupled to the socket, perpendicular to the socket;
    coupling a package directly to the socket;
    coupling an integrated heat spreader (IHS) lid to the package; and
    coupling a heat sink to the IHS lid, wherein at least one retention clamp is coupled to the at least one retention arm to secure placement of the heat sink against the IHS lid, and wherein the at least one retention arm, the at least one retention clamp and the socket are monolithic.

21. The method according to claim 20, wherein the socket, the retention clamp, and the at least one retention arm are formed from a unitary member.

22. The method according to claim 20, wherein the at least one retention arm is plastic.

23. The method according to claim 20, wherein the socket is plastic.

24. A method of retaining a heat sink to a package, comprising:

coupling a socket directly to a motherboard, wherein the socket is a single piece, and at least one retention arm is coupled to the socket, perpendicular to the socket;

coupling a package directly to the socket; and coupling a heat sink to the package, wherein at least one retention clamp is coupled to the at least one retention arm to secure placement of the heat sink against the package, wherein the at least one retention arm, the at least one retention clamp, and the socket are monolithic.

25. The method according to claim 24, wherein the socket, the retention clamp, and the at least one retention arm are formed from a unitary member.

26. The method according to claim 24, wherein the at least one retention arm is plastic.

27. The method according to claim 24, wherein the socket is plastic.

* * * * *